United States Patent [19]

Bert

[11] Patent Number: 4,528,524
[45] Date of Patent: Jul. 9, 1985

[54] HYPERFREQUENCY POWER OSCILLATOR
[75] Inventor: Alain Bert, Gif-sur-Yvette, France
[73] Assignee: Thomson-CSF, Paris, France
[21] Appl. No.: 534,647
[22] Filed: Sep. 22, 1983
[30] Foreign Application Priority Data
Sep. 24, 1982 [FR] France ................. 82 16158
[51] Int. Cl.$^3$ ............................. H03L 1/00
[52] U.S. Cl. .................... 331/56; 331/49; 331/117 D; 331/117 FE
[58] Field of Search ............... 331/38, 49, 50, 56, 331/96, 99, 100, 117 D, 117 FE

[56] References Cited
U.S. PATENT DOCUMENTS
4,187,476 2/1980 Shinkawa et al. ............ 331/117 D FOREIGN PATENT DOCUMENTS
123285 7/1948 Australia ..................... 331/56

Primary Examiner—Eugene R. LaRoche
Assistant Examiner—Robert J. Pascal
Attorney, Agent, or Firm—Oblon, Fisher, Spivak, McClelland & Maier

[57] ABSTRACT

A power oscillator for transmitter equipment operating at hyperfrequencies such as microwave links and radar. A plurality of elementary oscillators are coupled in parallel. Each elementary oscillator comprises a field effect transistor (FET) (11) connected in the common drain configuration with a first microstrip (51) connected to its gate and a second (21) connected to its source. Adjacent gates are interconnected by first resistances (R1) and adjacent sources by second resistances (R2). The resistances serve to balance the oscillators and to suppress parasitic oscillation. The free ends of the gate microstrips (21) are interconnected to synchronize the oscillators and the free ends of the source microstrips (51) are interconnected to constitute the oscillator outlet. The FETs may be disposed in a line or in a ring.

6 Claims, 8 Drawing Figures

HYPERFREQUENCY POWER OSCILLATOR

The present invention relates to a hyperfrequency power oscillator which is synchronizable and which is constituted by a plurality of elementary oscillators connected in parallel. It also relates to two embodiments of said power oscillator, a first embodiment of linear topology, and a second embodiment of circular topology. A power oscillator in accordance with the invention can be used as a power source for hyperfrequency transmission, e.g. in radar or in telecommunications equipment.

BACKGROUND OF THE INVENTION

When long distance transmission is required in radar or in microwave telecommunications, it is necessary to have a hyperfrequency power source. Such sources are obtained either by using a low power source and then amplifying to the required power level, or else by using a high power oscillator which is synchronized to a low power oscillator. The most frequently used power stage components, when operating at more than 10 watts and in the X or Ku bands, are valve and avalanche diodes. Valve technology is old, and has certain advantages, but it is awkward to integrate with present day semiconductor technology. Avalanche diodes are single port devices and therefore they are not capable of being directly controlled and synchronized.

SUMMARY OF THE INVENTION

The present invention provides a hyperfrequency power oscillator constituted by a plurality of elementary oscillators coupled in parallel, the improvement wherein each elementary oscillator comprises a field effect transistor (FET) connected in a common drain configuration (ie. with its drain connected to electrical ground), with its source being connected to a quarter-wave ($\lambda g/4$ where $\lambda g$ is the guided wavelength of the oscillation) microstrip resonant line, and its gate being connected to a quarter-wave ($\lambda g/4$) microstrip impedance-matching line, the microstrip lines connected to the gates of the elementary oscillators being inteconnected at their ends opposite to their ends connected to the gates, the microstrip lines connected to the sources being interconnected at their ends copposite to their ends connected to the sources, said interconnected ends of the source-connected microstrip lines constituting the output from said power oscillator, the gates being inteconnected by first resistances, and the sources being interconnected by second resistances, said first and second resistances serving for balancing purposes and for suppressing parasitic oscillations.

The effect of replacing dipole diodes with quadripole transistors in accordance with the invention, not only facilitates the synchronization of the various semiconductor devices constituting the oscillator, thereby generating a purer waveform, but also:

makes a wider variety of circuit topologies available, given that the oscillating component is a quadripole device rather than a dipole device;

enables a lower operating voltage to be used;

improves efficiency, in that avalanche diodes generally need to have a series resistance connected in the bias circuit in order to avoid parasitic oscillation at low frequency; and provides less critical behavior as a function of bias loading conditions.

A common drain connected FET oscillates at a frequency which is controlled by the imaginary part of the impedance applied to its gate. Oscillators of great frequency stability can thus be obtained simply by ensuring that the impedance is freqency selective, e.g. by coupling the gate to a dielectric resonator which may be DC isolated from the drain. The gate is then self biasing, and a negative bias voltage need be supplied only to the source.

Connecting a plurality of similar oscillators in parallel presents problems with phase and synchronization, in particular because of the very high frequencies (GHz) encountered in hyperfrequency oscillators. That is why the gates are interconnected by resistances and why the sources are likewise interconnected by resistances. By interconnecting resistances serve both to bring the elementary oscillators into balance and to suppress parasitic modes of oscillation.

BRIEF DESCRIPTION OF THE DRAWINGS

Two embodiments of the invention are described by way of example with reference to the accompanying drawings, in which.

MORE DETAILED DESCRIPTION

Figure 1:
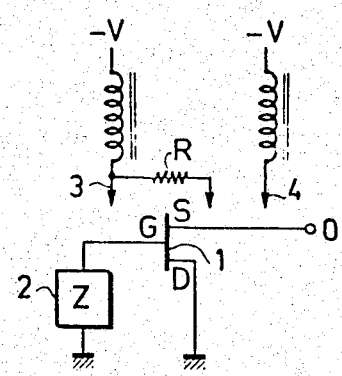
FIG. 1 is a circuit diagram of a prior art elementary oscillator.

FIG. 1 is a circuit diagram of a prior art FET oscillator. In the figure, an FET 1 is connected in the common drain configuration, i.e. its drain D is connected to electrical ground, with its source S serving as an output terminal and its gate G being loaded by an impedance Z. Such an oscillator may be powered or biased in two different ways. One method is to apply a negative voltage $-V$ from point 3 to the gate G of FET 1, and to apply the same voltage to its source S via a resistance R. Another method is to apply a voltage $-V$ from point 4 to the source S only, and to apply a suitable output load for the gate to bias itself. Given these two different circuit arrangements for biasing a FET, bias components are omitted from many of the following figures. It must nevertheless be understood that the FETs are suitably biased.

Figure 2:
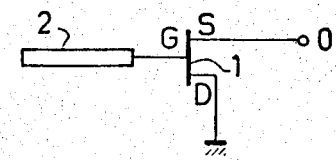
FIG. 2 is a circuit diagram of an FET having its gate connected to a dielectric oscillator in accordance with the prior art.

A suitably chosen impedance Z (represented by a block 2 in FIG. 1) causes a negative resistance to appear at the FET's output terminal. It is thus possible to maintain oscillations through a real load. In such a circuit, the frequency of oscillation is controlled essentially by the imaginary part of the impedance Z. Highly frequency stable oscillators can thus be obtained by making Z frequency selective, e.g. by coupling the gate to a dielectric resonator. A particularly advantageous mode of operation is for the gate to be DC isolated from the drain and not connected to any bias supply. With a suitable output load, the gate automatically biases itself to a value close to $(I_{DDS})/2$. In such circumstances the only bias required is a negative voltage connected to the source S. FIG. 2 is a circuit diagram of such an oscillator cell, in which the impedance applied to the gate is electrically isolated from the drain. In this case the impedance Z is the impedance of a length of microstrip which is terminated by an open circuit at the opposite end to the end which is connected to the FET's gate. The output of the oscillator cell is represented by a terminal 0 for connection to an active load.

Figure 3:
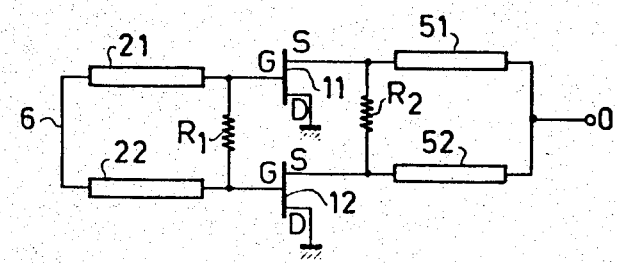
FIG. 3 is a circuit diagram of an oscillator in accordance with the invention and comprising two FETs.

FIG. 3 is a circuit diagram of a two FET power oscillator in accordance with the invention. As mentioned above, the manner in which the transistors are biased is not shown, since the biasing could be done in two different ways.

Each oscillator-constituting FET is connected to a gate impedance Z obtained from a microstrip line whose other end is open circuit, and its source is connected to a common load via another microstrip line. Typically the lines are about one quarter of a wavelength long. Thus, a FET 11 has its gate G loaded by a microstrip line 21 and its source S connected to a common output 0 via a microstrip line 51. Likewise a FET 12 has its gate G loaded by a microstrip line impedance 22 and its source S connected to the common output 0 via a microstrip line 52. The drains D of both FETs are connected to ground.

To couple the elementary oscillating cells to one another, the open circuit ends of the microstrip lines 21 and 22 are interconnected, as are the output ends of the strips 51 and 52 which connect the sources to the common output terminal 0. Further, balancing resistances $R_1$ and $R_2$ are connected as follows: the resistance $R_1$ interconnects the gates of the two FETs; and the resistance $R_2$ interconnects the sources of the two FETs.

This active structure has a symmetrical mode and an antisymmetrical mode. All types of antisymmetrical oscillation, including parasitic antisymmetrical mode oscillation are cancelled by the resistances $R_1$ and $R_2$ which serve both as balance resistances and to suppress parasitic modes of oscillation. Thus, in symmetrical mode, the circuit behaves like two oscillators of the type shown in FIG. 2, connected together in parallel and in equilibrium with each other. Antisymmetrical mode is suppressed by the resistances $R_1$ and $R_2$, and thus coupling the oscillator cells together in parallel ensures regular, balanced and synchronizable oscillation which is solely in symmetrical mode.

Figure 4:
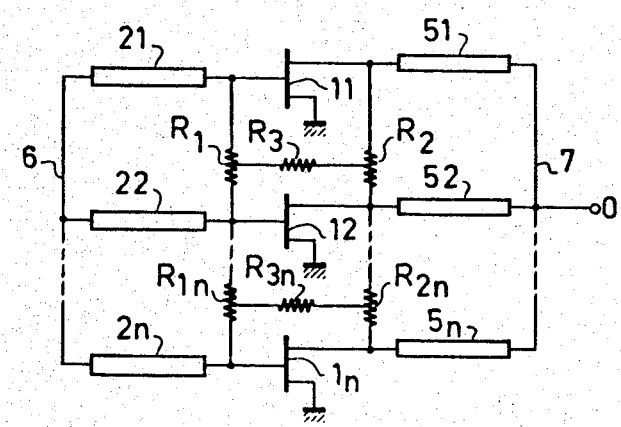
FIG. 4 is a generalization of the FIG. 3 circuit to n FETs.

FIG. 4 corresponds to a generalization of the circuit diagram of FIG. 3. This time there are n FETs for the purpose of obtaining greater radiated power. The numbers of transistors in this figure (n=3) and in the following figures have no direct bearing on the numbers of transistors that would be used in practice. In some configurations, a typical number of coupled FETs might be ten. Smaller numbers are shown in the figures merely to simplify the figures.

Apart from the number of transistors, the main difference of FIG. 4 in comparison to FIG. 3 is the provision of resistances $R_3$ to $R_{3n}$ interconnecting mid points of first resistances $R_1$ to $R_{1n}$ to the mid points of corresponding resistances $R_2$ to $R_{2n}$. For each oscillating cell in FIG. 4, the resistance value $2R_3+(R_1+R_2)/2$ corresponds to the resistance R connected to the point 3 in FIG. 1. In other words, if the first method of biasing is chosen for an oscillator in accordance with the invention with $-V$ volts being applied directly to the gates and indirectly to the sources, then the FET sources should be biased as shown in FIG. 4, ie. with suitable value resistances $R_3$ being connected between the mid points of corresponding pairs of balancing and antiparasitic resistances $R_1$ and $R_2$. Otherwise, if the second method of biasing is chosen, with $-V$ volts being applied directly to the sources, then the resistances $R_3$ are not required and should be dispensed with.

It is preferable to connect the bias resistances $R_3$ between the mid points of the appropriate resistances $R_1$ and $R_2$ as described above rather than directly to the gate and the source of each FET, since such an arrangement balances the bias voltages.

Figure 5:
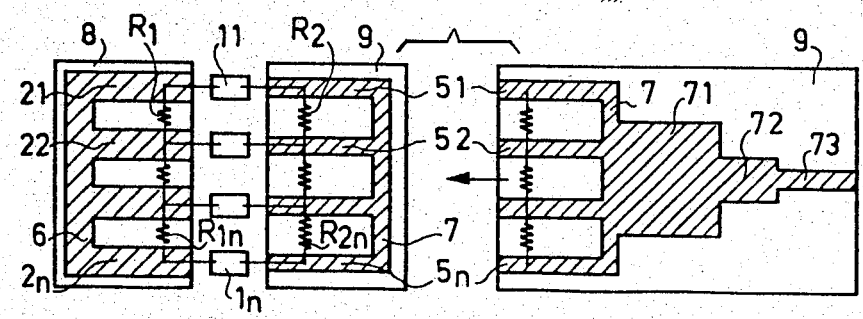
FIG. 5 is a plan view of two variants of an embodiment of the invention in a linear configuration.

FIG. 5 shows a linear embodiment of the invention. The figure only shows the active structure of the oscillator as seen from above. The substrate on which the oscillator is mounted, and the surrounding equipment such as a wave guide are not shown, in order to keep the figure simple. The left hand side of the figure shows a first linear embodiment, while the right hand side shows a variant structure for a portion thereof.

The first variant shown on the left hand side of FIG. 5 comprises a plurality of FET chips 11 to 1n which have their gates and their sources connected by connections that are as short as possible to a plurality of microstrip lines. On the gate side, the microstrips 21, 22, . . . 2n are deposited on a dielectric substrate 8 by metallization techniques known to the person skilled in the art. The substrate may be very slightly larger in size than the comb of microstrips formed thereon. A metal strip 6 shorts together the gate microstrips at their opposite ends to the ends connected to respective FET gates. The resistances $R_1$ and $R_{1n}$ for balancing the oscillators and for suppressing parasitic modes are deposited between the teeth of the microstrip comb by any suitable method such as silk screening. In other words they occupy the gaps between the microstrips 21, 22, . . . 2n. Opposite to the first substrate plate 8 on which the gate microstrips are formed, there is a second substrate plate 9 on which the source microstrips 51, 52, . . . , 5n are formed. Resistances $R_2$ to $R_{2n}$ are similarly deposited by a suitable method such as silk screening in the slots between adjacent microstrips. As with the first substrate, the second substrate need only be very slightly larger than the metal comb formed thereon.

On the source side of the FETs 11, . . . , 1n, there are two possible ways of short circuiting the source side microstrips 51, 52, . . . , 5n. A first way is as shown on the left hand side of FIG. 5, and consists in a simple metal strip 7 in the shape of an elongate rectangle or microstrip. In this case, the output load on the oscillator source would be the radiation impedance in a waveguide for example. A movable short circuit in the waveguide on the gate side enables the impedance transferred to the source to be adjusted; its normal position is about $\lambda_g/4$ from the FETs, the $\lambda_g$ is the wavelength of the guided wave in the waveguide.

A second way of shorting together the source side microstrips is shown on the right hand side of FIG. 5, and consists in one or more impedance convesion stages leading to a 50 ohm microstrip line. In this case the plate 9 has a grid of microstrips 51, 52, . . . , 5n interconnected by balancing resistances $R_2$ to $R_{2n}$ as before, but the short circuit between the output ends of the microstrips is constituted by a line whose cross section is reduced in steps 71, 72, 73, . . . . The specific number of such stages is not a feature of the invention, and each stage serves to transform impedance. Such stages are generally used to connect to a coaxial output.

Figure 6:
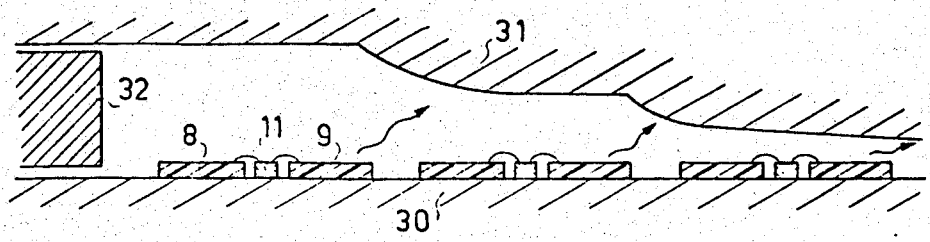
FIG. 6 is a cross section through equipment in which a plurality of linear configuration oscillators as shown in FIG. 5 are coupled together.

FIG. 6 shows one way in which a plurality of power oscillators in accordance with the invention may be coupled in a waveguide for microwaves. In the figure, the waveguide is represented diagrammatically by a bottom wall 30, a top wall 31 and a movable short circuit 32. A plurality of oscillators in accordance with the invention and as shown in FIG. 5 are placed on the bottom wall 30 inside the waveguide. Each of the oscillators has a radiating type output, as shown in the left hand side of FIG. 5. FIG. 6 is a section view and therefore only shows one FET 11 in each oscillator connected by short leads to two microstrips mounted on respective substrates 8 and 9. As in the previous figures, FET bias circuits are not shown since they would complicate the figure without being of direct relevance to the invention. The various power oscillator modules are separated from one another by a half wavelength $\lambda g/2$. The first oscillator module synchronizes the following modules. In order to ensure that each module contributes substantially the same power as the others, the waveguide impedance drops on approaching its outlet. This means that at least the top wall 31 facing the bottom wall 30 on which the power oscillator modules are mounted has a stepped shape with each step being opposite to one of the modules, thereby modifying the waveguide impedance at each stage.

Figure 7:
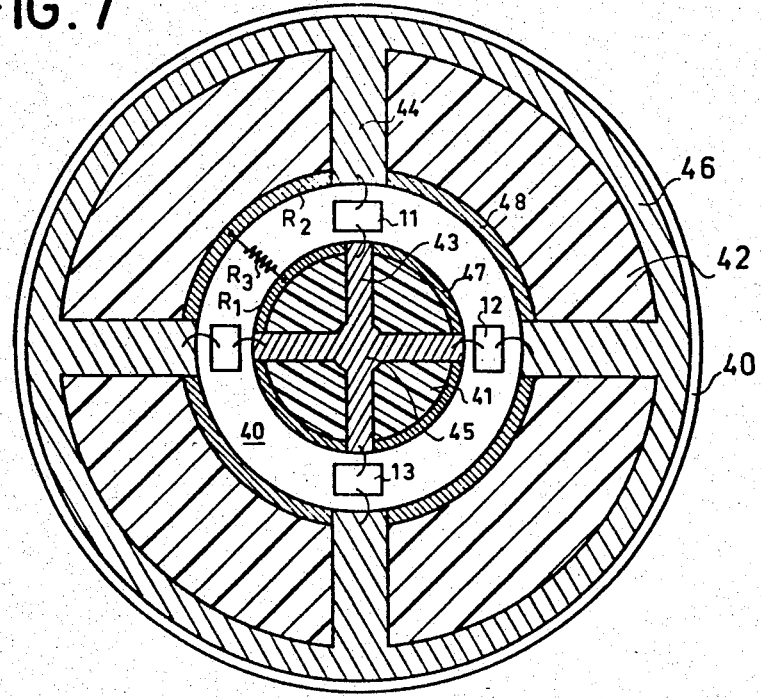
FIG. 7 is a cross section through an embodiment of the invention in a circle or ring configuration.
Figure 8:
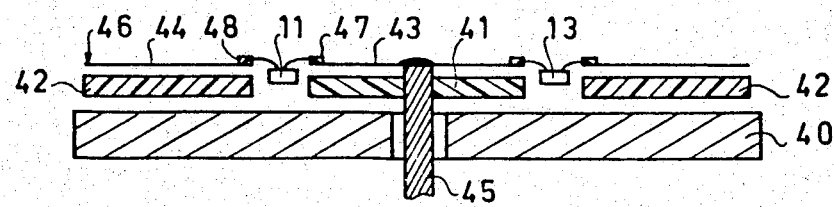
FIG. 8 is an axial section through the FIG. 7 embodiment.

FIG. 7 is a plan view of a second embodiment of the invention which employs a circular configuration or topology. FIG. 8 is an axial cross section through the FIG. 7 oscillator. FIGS. 7 and 8 should be used in conjunction with each other to facilitate understanding.

A metal support 40 serves both as an electrical ground connection and as a heat sink. Inner and outer concentric washers 41 and 42 made of dielectric material are fixed on the support 40. The inner or central washer 41 is a substrate for a star-shaped etched circuit comprising a plurality of metal strips 43 which corresponds to the microstrips 21 or 51 of FIG. 3. The center 45 of the star is baised by a coaxial cable, and corresponds to the short-circuit 6 or 7 of FIG. 3. The outer ring-shaped washer 42 is a substrate supporting a circuit which comprises both radial strips 44 corresponding to the microstrips 51 or 21 of FIG. 3, and a peripheral ring 46 corresponding to the short-circuit 7 or 6 of FIG. 3. FET chips 11, 12, 13, . . . have their substrates connected to the metal support 40, thereby connecting the drain of each FET to ground. Leads which are as short as possible connect the source and the gate of each FET to the microstrips 43 and 44. Resistive deposits 47 and 48 line the facing edges of the concentric washers so that the deposits 47 interconnect the microstrips 43 on the inner washer 41 and the deposits 48 interconnect the microstrips 44 on the outer washer 42. These resistive deposits correspond to the resistances $R_1$ and $R_2$ interconnecting the gates and interconnecting the sources.

So far the microstrips 43 and 44 in FIG. 7 have been ambiguously described as corresponding to the microstrips 21 and 51 of FIG. 3. This corresponds to two possible connection arrangements which may be used with the circular topology of FIGS. 7 and 8.

In a first case, the FET chips are arranged in such a manner that their sources are connected to the central circuits on the inner substrate 41 while their gates are connected to the outer circuits on the outer washer 42. The output from the power oscillator is then via the central coaxial cable 45 and the microstrips 43 are equivalent to the microstrips 51 of FIG. 3 while the resistive deposits 47 are equivalent to the resistances $R_2$ thereof. Likewise, since the gates are connected to the outer circuit, the microstrips 44 correspond to the microstrips 21 and the resistive deposits 48 correspond to the resistances $R_1$. With this arrangement, the frequency or oscillation is fixed by the size of the circuit on the outer washer 42. The gates of the transistors 11, 12, 13, . . . , are connected to respective quarter-wave microstrips whose opposite ends are shorted together by the metal ring 46. The gates are self biased or "floating". There is no need for a bias resistance between the source side of the circuit and the gate side of the circuit.

In the opposite case, the FET sources are connected to the outer washer and their gates are connected to the inner circuit. This means that the microstrips 44 are equivalent to the microstrips 51, the microstrips 43 to the microstrips 21 and the resistive deposits 48 and 47 to the resistances $R_2$ and $R_1$ respectively. The frequency can then be adjusted by modifying the impedance applied by the coaxial cable, and the output power is radiated from the outer ring 46. With such a radiating power source, the outer circuit can be optimized to obtain the radiation pattern most appropriate to the intended application, and instead of radiating the power into a waveguide as is conventional, the FIG. 7 circuit may be used directly as the active module of a scanning radar antenna with signal phase being determined by synchronizing the oscillator via the coaxial cable. In this second case, since the sources are connected to the outer washer substrate 42, and since it is not easy to provide the necessary bias via the outer ring 46, biasing may be provided by the coaxial cable 45 which is connected to the inner substrate 41. If this is done, the biasing is of the type shown connected to the point 3 in FIG. 1. The resistance R is provided by a plurality of resistances $R_3$ (only one of which is shown) interconnecting the mid points of facing resistive deposits 47 and 48. The resistances $R_3$ may be of the etched or of the deposited type. Naturally there are as many resistances $R_3$ as there are FETs.

In the axial section of FIG. 8, the various layers of material have been slightly separated from one another in order to clarify the drawing. Naturally they are in close physical contact in a functioning circuit.

The above description of embodiments of the invention using two, three of four FETs should not be taken as limiting the invention to such small numbers. The invention concerns coupling a plurality of FETs in parallel, and typical practical circuits will use eight or ten FETs in parallel.

Power oscillators in accordance with the invention are applicable to any electronic equipment which is required to emit a wave at several GHz, and in particular they are applicable to microwave telecommunications and to radar.

I claim:

1. A hyperfrequency power oscillator constituted by a plurality of elementary oscillators coupled in parallel, the improvement wherein each elementary oscillator comprises a field effect transistor (FET) connected in a common drain configuration (ie. with its drain connected to electrical ground), with its source being connected to a quarter-wave $\lambda g/4$, (where $\lambda g$ is the guided wavelength of the oscillation) microstrip line, and its gate being connected to a quarter-wave ($\lambda g/4$) microstrip line, the microstrip lines connected to the gates of the elementary oscillators being interconnected at their ends opposite to their ends connected to the gates, the microstrip lines connected to the sources being interconnected at their ends opposite to their ends connected to the sources, said interconnected ends of the source-connected microstrip lines constituting the output from said power oscillator, the gates being inteconnected by first resistances and the sources being interconnected by second resistances, said first and second resistances serving for balancing purposes and for suppressing parasitic oscillations.

2. A hyperfrequency power oscillator according to claim 1, wherein the oscillator has a linear configuration and comprises a metal base plate on which a plurality of FETs are mounted in a line between first and second dielectric substrates, said first substrate supporting a plurality of quarter-wave first microstrip lines disposed in parallel with a first end of each of said first microstrip lines being connected to the gate of a corresponding FET and also being connected, via respective first resistances, to each adjacent microstrip line, the opposite ends of the first microstrip lines being interconnected by a metal strip, said second substrate supporting a plurality of second microstrip lines disposed in parallel with a first end of each of said second microstrip lines being connected to the source of a corresponding FET and also being connected, via respective second resistances, to each adjacent microstrip line, the opposite ends of the second microstrip lines being interconnected by a metal strip which constitutes the output from said power oscillator.

3. A hyperfrequency power oscillator according to claim 2, wherein the output impedance is matched by means of metalization in a step pattern with each step constituting one stage of impedance transformation.

4. A hyperfrequency power oscillator according to claim 1, wherein the oscillator has a circular configuration and comprises a metal base plate on which a plurality of FETs are mounted in a circle between first and second concentric dielectric substrates;

said first substrate being circular and supporting a circuit comprising a star-shaped configuration of etched microstrips extending radially from a central interconnection, and first resistances disposed round the periphery of the substrate to interconnect the ends of adjacent microstrips, said central interconnection being connected to a coaxial outlet;

said FETs being disposed adjacent to the peripheral ends of said microstrips;

said second substrate being annular and supporting a circuit comprising etched microstrips extending radially from an inner edge of the substrate to an outer edge thereof, the outer ends of the microstrips being interconnected by metalization around said outer edge and the inner ends of said microstrips being interconnected by second resistances disposed round said inner edge of the substrate, the inner ends of the microstrips of the second substrate being disposed in the proximity of the outer ends of the corresponding microstrips of the first substrate; and said FETs having their drain electrodes connected to the metal base plate, a first one of their other two electrodes connected to the respective adjacent microstrips of the first substrate, and a second one of said other two electrodes connected to the respective adjacent microstrips of the second substrate.

5. A hyperfrequency power oscillator according to claim 4, wherein each FET has its source electrode connected to the central, first substrate and its gate electrode connected to the outer, second substrate, the power output from said oscillator being absorbed by said coaxial outlet.

6. A hyperfrequency power oscillator according to claim 4, wherein each FET has its source electrode connected to the outer, second substrate and its gate electrode connected to the inner, first substrate, the power emitted by the oscillator being applied to the metalization around the outer edge of the outer substrate, and additional resistances being connected between each first resitance on the periphery of the inner substrate and the corresponding second resistance on the inner edge of the second substrate, said additional resistances serving to bias the FET source electrodes.

* * * * *